US012681110B2

(12) United States Patent
Romero

(10) Patent No.:  US 12,681,110 B2
(45) Date of Patent:     Jul. 14, 2026

(54) CONTINUOUSLY CALIBRATED MAGNETIC FIELD SENSOR WITH IN-BAND CALIBRATION

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 246 days.

(21) Appl. No.: 18/458,509

(22) Filed: Aug. 30, 2023

(65) Prior Publication Data

US 2025/0076414 A1      Mar. 6, 2025

(51) Int. Cl.
*G01R 33/00* (2006.01)
*G01R 33/02* (2006.01)
*G01R 33/09* (2006.01)

(52) U.S. Cl.
CPC ..... *G01R 33/0017* (2013.01); *G01R 33/0206* (2013.01); *G01R 33/09* (2013.01)

(58) Field of Classification Search
CPC ...................... G01R 33/0017; G01R 33/0206; G01R 33/09; G01R 33/0041; G01R 33/022; G01R 33/0035
See application file for complete search history.

(56) References Cited

U.S. PATENT DOCUMENTS

| | | |
|---|---|---|
| 4,590,583 A | 5/1986 | Miller |
| 4,860,317 A | 8/1989 | Tomlinson |

| | | |
|---|---|---|
| 7,923,996 B2 | 4/2011 | Doogue et al. |
| 8,030,918 B2 | 10/2011 | Doogue et al. |
| 8,729,892 B2 | 5/2014 | Friedrich |
| 8,907,669 B2 | 12/2014 | Petrie |

(Continued)

FOREIGN PATENT DOCUMENTS

| | | | | |
|---|---|---|---|---|
| CN | 107305241 | * 10/2017 | ............. | G01R 33/07 |
| CN | 107305241 W | 10/2017 | | |

OTHER PUBLICATIONS

International Search Report and Written Opinion dated Mar. 19, 2024, for International Application No. PCT/US2023/081504; 14 pages.

(Continued)

*Primary Examiner* — Alvaro E Fortich
(74) *Attorney, Agent, or Firm* — Daly, Crowley, Mofford & Durkee, LLP

(57) ABSTRACT

A system, comprising: a reference magnetic field source that is configured to generate a reference magnetic field; a plurality of magnetic field sensing elements arranged in a sensing bridge, the sensing bridge being configured to sense the reference magnetic field and an external magnetic field simultaneously, the sensing bridge being configured to output a first signal and a second signal; a first circuit that is configured to generate a common mode signal of the sensing bridge based on the first signal and the second signal; an adjustment circuit that is configured to adjust a sensitivity of the sensing bridge based, at least in part, on a common mode signal of the sensing bridge; and a processing circuitry that is configured to use a differential signal of the sensing bridge to generate an output signal, the differential signal being based on a strength of the external magnetic field.

20 Claims, 6 Drawing Sheets

(56) References Cited

U.S. PATENT DOCUMENTS

| | | | |
|---|---|---|---|
| 9,201,122 B2 | 12/2015 | Cesaretti et al. | |
| 9,404,991 B2 | 8/2016 | Anelli et al. | |
| 9,645,220 B2 | 5/2017 | Cesaretti et al. | |
| 9,804,222 B2 | 10/2017 | Petrie et al. | |
| 9,817,078 B2 | 11/2017 | Pepka et al. | |
| 9,841,485 B2 | 12/2017 | Petrie et al. | |
| 9,910,088 B2 | 3/2018 | Milano et al. | |
| 10,073,136 B2 | 9/2018 | Milano et al. | |
| 10,132,879 B2 | 11/2018 | Latham et al. | |
| 10,488,458 B2 | 11/2019 | Milano et al. | |
| 10,574,258 B1 | 2/2020 | Albel et al. | |
| 10,823,789 B2 | 11/2020 | Rossi et al. | |
| 10,908,232 B2 | 2/2021 | Latham et al. | |
| 11,169,223 B2 | 11/2021 | Ostermann et al. | |
| 11,313,899 B2 | 4/2022 | Milano et al. | |
| 11,366,141 B1 | 6/2022 | Daubert et al. | |
| 11,402,440 B2 | 8/2022 | Chaware et al. | |
| 11,467,235 B1 | 10/2022 | Romero et al. | |
| 11,630,130 B2 | 4/2023 | Rubinsztain et al. | |
| 11,630,169 B1 | 4/2023 | Liu et al. | |
| 11,680,996 B2 | 6/2023 | Pepka et al. | |
| 11,782,105 B2 | 10/2023 | Klebanov et al. | |
| 11,927,650 B2 | 3/2024 | Romero | |
| 2007/0247141 A1* | 10/2007 | Pastre | G01R 33/07 |
| | | | 324/202 |
| 2013/0093412 A1 | 4/2013 | Anelli et al. | |
| 2013/0214774 A1 | 8/2013 | Cesaretti et al. | |
| 2017/0067980 A1 | 3/2017 | Thiagarajan et al. | |
| 2017/0336481 A1 | 11/2017 | Latham et al. | |
| 2019/0317175 A1* | 10/2019 | Polley | G01R 33/0035 |
| 2019/0339337 A1* | 11/2019 | Sharma | G01R 33/098 |
| 2020/0096543 A1* | 3/2020 | Romero | G01R 15/205 |
| 2020/0393529 A1 | 12/2020 | Larson et al. | |

OTHER PUBLICATIONS

U.S. Non-Final Office Action dated Nov. 1, 2024 for U.S. Appl. No. 18/152,189; 11 Pages.

U.S. Appl. No. 18/152,189, filed Jan. 10, 2023, Romero.

Response to U.S. Non-Final Office Action dated Nov. 1, 2024 for U.S. Appl. No. 18/152,189; Response Filed Nov. 21, 2024; 12 Pages.

U.S. Notice of Allowance dated Dec. 11, 2024 for U.S. Appl. No. 18/152,189; 12 Pages.

Search Reporting and Written Opinion dated Oct. 17, 2024; for PCT Application No. PCT/US2024/037167; 15 pages.

Response to European Pursuant to Rules 161/162 dated Jul. 30, 2025 for European Application No. 23836665.2; Response Filed Sep. 22, 2025; 28 Pages.

\* cited by examiner

- - - -> - DIRECTION OF REFERENCE MAGNETIC FIELD

──────> - DIRECTION OF EXTERNAL MAGNETIC FIELD

- DIRECTION OF EXTERNAL MAGNETIC FIELD

- - - - ► - DIRECTION OF REFERENCE MAGNETIC FIELD

500

504

508

502  Processor     Volatile Memory     Output Device

520

510

506  Non-Volatile Memory

UI, E.G., GUI,
Keyboard, etc.

512  Computer Instructions

514  Operating System

518

516  Data

CONTINUOUSLY CALIBRATED MAGNETIC FIELD SENSOR WITH IN-BAND CALIBRATION

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a system is provided, comprising: a reference magnetic field source that is configured to generate a reference magnetic field; a plurality of magnetic field sensing elements arranged in a sensing bridge, the sensing bridge being configured to sense the reference magnetic field and an external magnetic field simultaneously, the sensing bridge being configured to output a first signal and a second signal; a first circuit that is configured to generate a common mode signal of the sensing bridge based on the first signal and the second signal; an adjustment circuit that is configured to adjust a sensitivity of the sensing bridge based, at least in part, on a common mode signal of the sensing bridge; and a processing circuitry that is configured to use a differential signal of the sensing bridge to generate an output signal, the differential signal being based on a strength of the external magnetic field.

According to aspects of the disclosure, a system is provided, comprising: a plurality of magnetic field sensing elements arranged in a sensing bridge, the sensing bridge being configured to output a first signal and a second signal; a reference magnetic field source that is configured to generate a reference magnetic field; a feedback loop that is arranged to process a common mode signal of the sensing bridge, the feedback loop including: (i) circuitry that is configured to extract a reference field signal by demodulating and filtering the common mode signal, (ii) a subtraction circuit that is configured to calculate a difference between the reference field signal and a nominal value corresponding to the reference field signal and (ii) an adjustment circuit that is configured to adjust a sensitivity of the sensing bridge based, at least in part, on the difference; and an output signal path that is configured to generate an output signal that corresponds to an external magnetic field, the output signal being based, at least in part, on a differential signal of the sensing bridge.

According to aspects of the disclosure, a system is provided, comprising: means for generating a reference magnetic field that is in-band with an external magnetic field; means for receiving a first signal and a second signal that are output by a sensing bridge that is configured to sense both the external magnetic field and the reference magnetic field; means for using the first signal and the second signal to derive a common mode signal of the sensing bridge and adjusting a sensitivity based, at least in part, on the common mode signal; and means for generating an output signal that corresponds to the external magnetic field.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

FIG. 5 is a diagram of an example of a computing device, according to aspects of.

DETAILED DESCRIPTION

Figure 1A:
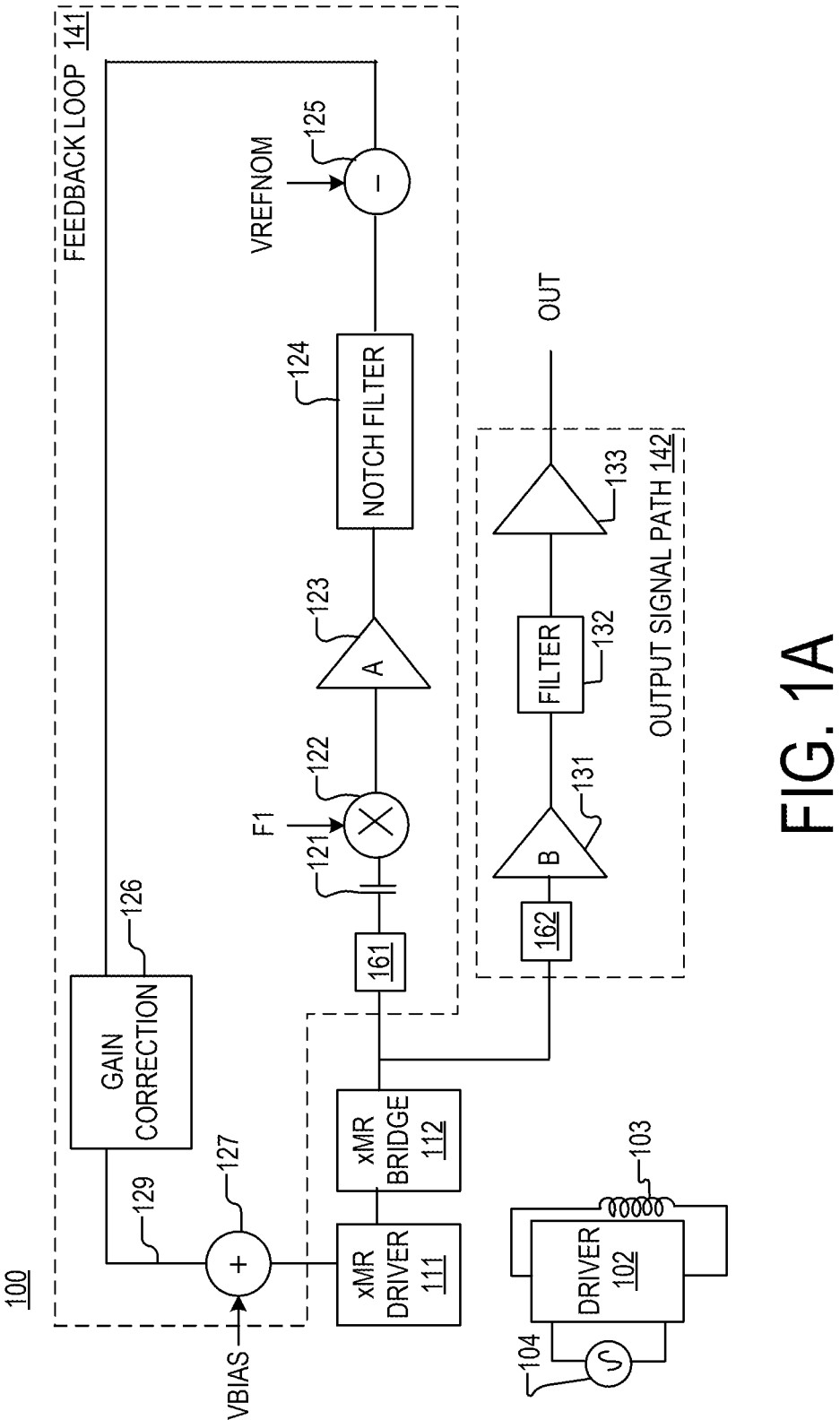
FIG. 1A is a diagram of an example of a sensor, according to aspects of the disclosure.

FIG. 1A is a diagram illustrating an example of a magnetic field sensor 100, according to aspects of the disclosure. Sensor 100 may be configured to sense an external magnetic field and produce an output signal OUT that is generated, at least in part, based on the external magnetic field. The external magnetic field may be a field that is generated by a moving target, an electric conductor, and/or any other suitable type of magnetic field source. The output signal may be indicative of the level of the electrical current through a conductor, the speed of rotation of a target, the position of the target, and/or any other quantity that is detectable by using magnetic field measurements. According to the present example, sensor 100 is a current sensor. However, alternative implementations are possible in which the sensor 100 is another type of magnetic field sensor, such as a position sensor, an angle sensor, a speed sensor, and/or any other type of magnetic field sensor.

Sensor 100 may employ a method for continuously calibrating the sensitivity of a sensing bridge 112 that is part of sensor 100. The calibration may be performed by using a reference magnetic field which is in-band with the external magnetic field. Having the reference magnetic field be in-band with the external magnetic field is advantageous because this may enable sensor 100 to have a higher bandwidth than if the reference field is out-of-band relative to the external field. As is discussed further below, the use of an in-band reference magnetic field is made possible by utilizing a configuration of the sensing bridge that causes the reference magnetic field to elicit a common-mode response in sensing bridge 112 that allows signal components attributable to the reference magnetic field to be separated from signal components attributable to the external magnetic field through the use of filtering and demodulation.

As used herein, the term "reference magnetic field" refers to a magnetic field that is used to adjust the sensitivity of sensing bridge 112. As used herein, the term "reference field signal" refers to a signal (or portion thereof) that is generated, at least in part, by sensing bridge 112 in response to the reference magnetic field. As used herein, the term "external magnetic field" refers to a magnetic field that is sensed by sensing bridge 112 to generate an output signal OUT of sensor 100. The "external magnetic field" in other words may be the magnetic field that sensor 100 is designed (or used) to measure, and which is of interest to the user of sensor 100. As used herein, the term "external field signal" refers to a signal (or portion thereof) that is generated, at least in part, by sensing bridge 112 in response to the external magnetic field. In one example, the external magnetic field may be generated by an object that is external to sensor 100, such as a gear or another type of target. In another example, the external magnetic field may be generated by a conductor that is built into the packaging of sensor 100 and connected in line with an external conductive trace or wire. In yet another example, the external magnetic field may be generated by a wire that is situated outside of the packaging of sensor 100.

The frequency band of the external magnetic field may be determined by the design specification of sensor 100. As can be readily appreciated, sensor 100 may be designed in accordance with design specifications that specify characteristics (e.g., frequency range, etc) of external magnetic fields which the sensor 100 is designed to sense, and the internal circuitry of sensor 100 may be tuned to process electrical signals possessing such properties as would be caused by an external magnetic field having the specified characteristics. In one example, a reference magnetic field may be considered in-band with the external magnetic field of sensor 100, if the frequency of the reference magnetic field falls, partially or fully, into the specified frequency range for sensor 100.

Sensor 100 may include a transmitting structure 103, a driver 102, and an alternating current (AC) source 104. The transmitting structure 103 may include one or more transmitting coils, one or more conductive traces, and/or any other suitable type of element that is configured to generate the reference magnetic field discussed above. Driver 102 may be configured to receive power from AC (or DC) source 104 and use the received power to drive the transmitting structure 103. Specifically, driver 102 may cause the transmitting structure 103 to generate a reference magnetic field that is in-band with the external magnetic field that is being sensed by sensor 100. The reference magnetic field may have a frequency F1 (which could be zero as a particular case). Although, in the present example, the source 104 is an AC current source, alternative implementations are possible in which current source 104 is a direct current (DC) source.

Figure 2A:
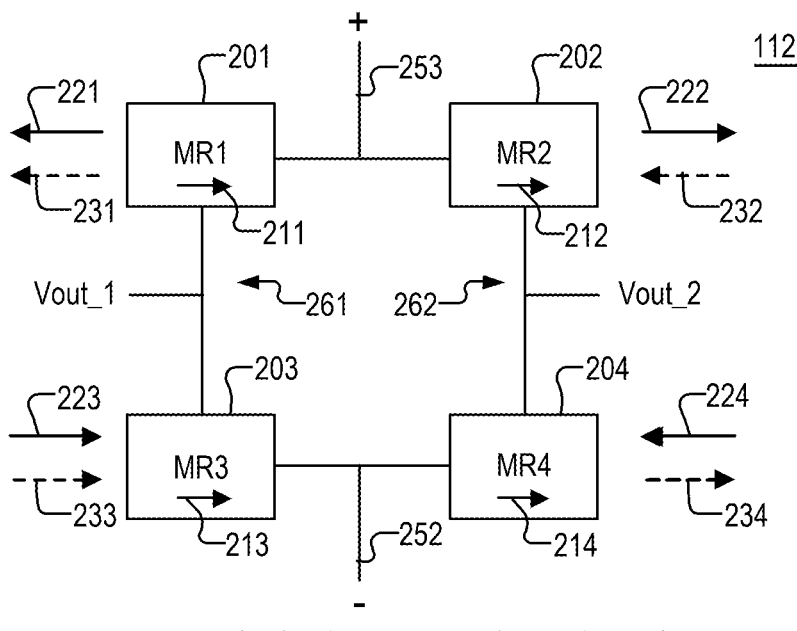
FIG. 2A is a diagram of an example of a sensing bridge, according to aspects of the disclosure.
Figure 3A:
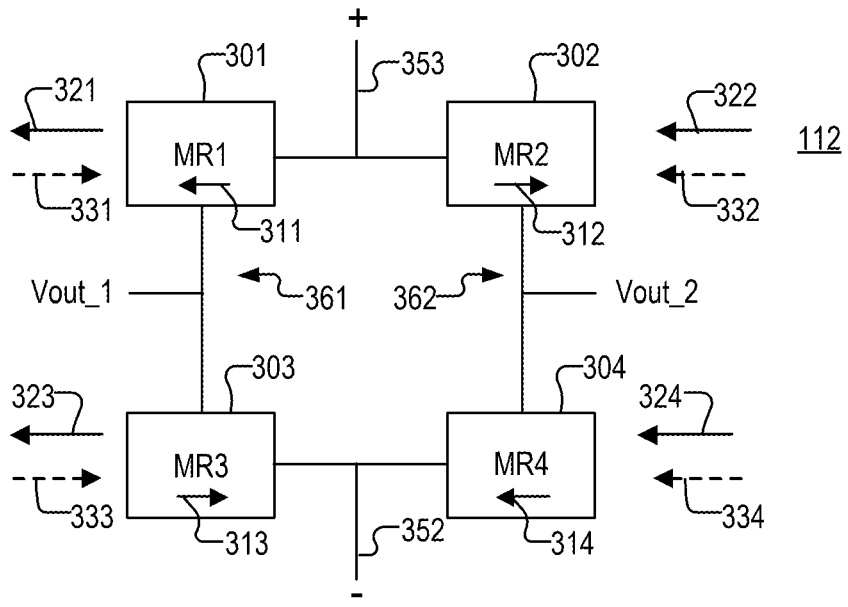
FIG. 3A is a diagram of an example of a sensing bridge, according to aspects of the disclosure.

Sensor 100 may further include a driver circuit 111, sensing bridge 112, a feedback loop 141, and an output signal path 142. Output signal path 142 may include a circuit 162, an amplifier 131, a filter 132, and an output driver 133. Circuit 162 may calculate the differential output of sensing bridge 112 based on the outputs Vout_1 and Vout_2 of sensing bridge 112. Examples of the outputs Vout_1 and Vout_2 of sensing bridge 112 are shown in FIGS. 2A and 3A. Amplifier 131 may amplify the differential output of sensing bridge 112 to produce an amplified differential signal. Filter 132 may filter the amplified differential signal to produce a filtered differential signal. Based on the filtered differential signal, output driver 133 may generate the output signal OUT which is discussed above. As can be readily appreciated, because output signal OUT is generated, at least in part, based on the external field signal that is output from sensing bridge 112, output signal OUT may be at least in part indicative of the strength (e.g., indicative of the absolute value of the strength and/or indicative of relative changes in the strength) of the external magnetic field. As noted above, the reference magnetic field that is generated by transmitting structure 103 may be in-band with the external magnetic field.

Output signal path 142 is provided as an example only. It will be understood that the present disclosure is not limited to any specific implementation of output signal path 142. By way of example, in some implementations, output signal path 142 may include digital processing circuitry and/or any other suitable type of circuitry that is known to be used in magnetic field sensors to generate an output signal. Although the example of FIG. 1A uses circuit 162 that converts outputs Vout_1 and Vout_2 of sensing bridge 112 (shown in FIGS. 2A and 3A) to a single-ended signal, alternative implementations are possible in which circuit 162 is omitted and the outputs Vout_1 and Vout_2 are used directly to generate the output signal OUT. Stated succinctly, the term "differential output of sensing bridge 112" may refer to a single-ended signal that is based on the difference between outputs Vout_1 and Vout_2 or a differential pair of signals that consists of the outputs Vout_1 and Vout_2.

Feedback loop 141 may include a circuit 161, a blocking capacitor 121, a demodulator 122, an amplifier 123, a notch filter 124, a subtraction circuit 125, a gain correction circuit 126, and an addition circuit 127. In operation, circuit 161 may calculate the common mode output of sensing bridge 112 and provide the common mode output to blocking capacitor 121. Blocking capacitor 121 may block the low-frequency parts of the external field signal while letting the reference field signal go through. The output of blocking capacitor 121 may be demodulated at the frequency of the reference magnetic field (F1 in the example of FIG. 1A). As a result, the reference field signal is brought back to base-band while the remainder of the external field signal (that cannot be blocked by blocking capacitor 121) is shifted to higher frequencies. Amplifier 123 may amplify the output of demodulator 122. Notch filter 124 (and/or another type of analog filter) may remove (fully or mostly) the remainder of the external field signal (after it is shifted to higher frequencies) leaving only (or mostly) the reference field signal. The subtraction circuit 125 may subtract the expected value VREFNOM of the reference field signal from the reference field signal (output from notch filter 124) to yield the difference by which the actual value of the reference field signal differs from the expected value of the reference field signal. In this example, the expected value VREFNOM of the reference field signal is the value that the reference field signal is expected to have under ideal circumstances in which the output of sensing bridge 112 is sufficiently (and/or completely) accurate, such that no further calibration or adjustment of the sensitivity of sensing bridge 112 is needed.

Gain correction circuit 126 may receive the difference that is calculated (in the analog domain) by subtraction circuit 125, and generate an adjustment signal 129, which is subsequently added to the value of a bias voltage VBIAS of the driver circuit 111. The addition may be performed by using addition circuit 127. Adding the adjustment signal 129 to the bias voltage VBIAS effectively changes the voltage that is supplied by the driver circuit 111 to the sensing bridge 112, causing the sensitivity of the sensing bridge 112 to change in a desired direction, and by a desired amount. Although in the present example, the bias voltage of sensing bridge 112 is changed, alternative implementations are possible in which a bias current of the sensing bridge is changed instead. In one example, gain correction circuit may be implemented by using an integrator circuit (or a circuit that acts as an integrator in practice. In other words, gain correction circuit 126 may include a high linear gain block. In such implementations, the relationship between gain adjustment signal 129 and the input to gain correction circuit 126 may be described by the equation of $signal_{126}=k*signal_{in}$, where $signal_{126}$ is the signal 126, $signal_{in}$ is the input to gain correction circuit 126 (i.e., the output of subtraction unit 125), and $k=10^5$.

Figure 1B:
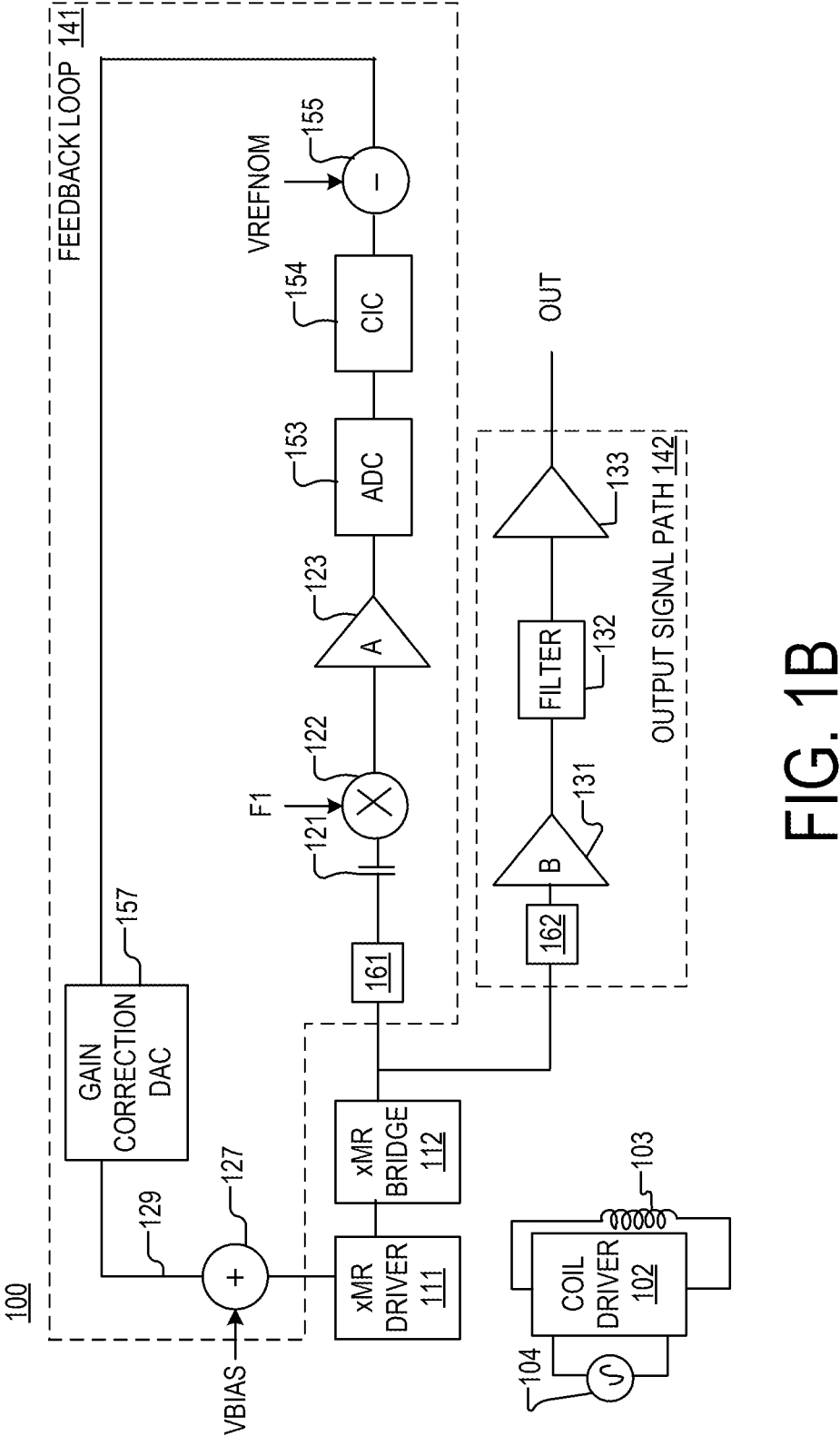
FIG. 1B is a diagram of an example of a sensor, according to aspects of the disclosure.

FIG. 1B is a diagram of sensor 100, according to another implementation. In the implementation of FIG. 1B, feedback loop 141 is configured to operate in the digital domain, whereas in the implementation of FIG. 1A, feedback loop 141 operates strictly in the analog domain.

Specifically, in the example of FIG. 1B, feedback loop 141 includes the circuit 161, the blocking capacitor 121, the demodulator 122, the amplifier 123, an analog-to-digital converter (ADC) 153, a comb filter 154, a subtraction circuit 155, a digital gain correction circuit 157, and the addition circuit 127. In other words, in the example of FIG. 1B, notch filter 124 (shown in FIG. 1A) is replaced with comb filter 154, and ADC 153 is placed between amplifier 123 and comb filter 154. In addition, in the example of FIG. 1B, gain correction circuit 126 (shown in FIG. 1A) is replaced with digital gain correction circuit 157. Apart from these differences, the example of FIG. 1B is the same as the example of FIG. 1A.

The operation of feedback loop 141, according to the example of FIG. 1B, is now described in further detail. Circuit 161 may calculate the common mode output of sensing bridge 112 and provide the common mode output to blocking capacitor 121. Blocking capacitor 121 may block the low-frequency parts of the external field signal while letting the reference signal go through. The output of blocking capacitor 121 may be demodulated at the frequency of the reference signal (F1 in the example of FIG. 1*i*). As a result, the reference signal is brought back to baseband while the remainder of the external field signal (that cannot be blocked by blocking capacitor 121) is shifted to higher frequencies. These two signals are amplified by amplifier 123 and subsequently digitized by ADC 153. ADC 153 may act as an integrator therefore providing initial low-pass filtering. Comb filter 154 (and/or another type of digital filter) may provide further low-pass filtering, fully (or mostly) eliminating any remainder of the external field signal that is still present in the output of ADC 153. Subtraction circuit 155 may subtract (in the digital domain) the expected value VREFNOM of the reference signal from the reference field signal (output from comb filter 154) to yield the difference by which the actual value of the reference signal differs from the expected value of the reference signal.

Gain correction circuit 157 may include digital processing circuitry and a digital-to-analog converter (DAC). The digital processing circuitry may receive the difference that is calculated by subtraction circuit 155 and generate a digital adjustment signal based on the difference. The DAC may convert the digital adjustment signal to an analog adjustment signal 129. The adjustment signal 129 may be subsequently added to the value of a bias voltage VBIAS of the driver circuit 111. The addition may be performed by using addition circuit 127. Adding the adjustment signal 129 to the bias voltage VBIAS effectively changes the voltage that is supplied by the driver circuit 111 to sensing bridge 112, causing the sensitivity of the sensing bridge 112 to change in a desired direction, and by a desired amount.

Figure 2B:
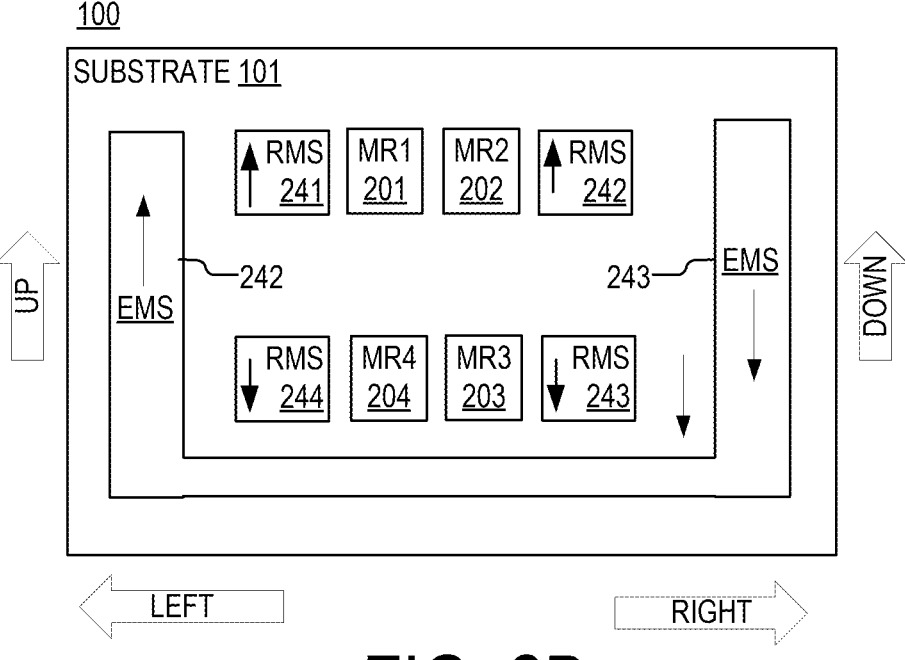
FIG. 2B is a diagram showing the relative positioning of the elements of the sensing bridge of FIG. 2A, according to aspects of the disclosure.

FIGS. 2A-B show an example of one possible configuration of sensing bridge 112, according to aspects of the disclosure. As illustrated, sensing bridge 112 may include sensing elements 201, 202, 203, and 204. Sensing elements 201 and 203 may be coupled in series to form a leg 261 of sensing bridge 112. Sensing elements 202 and 204 may be coupled in series to form a leg 262 of sensing bridge 112. Legs 261 and 262 may be coupled in parallel between a positive terminal 253 and a negative terminal 252 of sensing bridge 112. The output Vout_1 of sensing bridge 112 may be provided between sensing elements 201 and 203 and the output Vout_2 of sensing bridge 112 may be provided between sensing elements 202 and 204. The common mode output of sensing bridge 112 may be calculated, by circuit 161, in accordance with the equation of: common_mode_output=(signal_1+signal_2)/2, where signal_1 is output Vout_1 and signal_2 is output Vout_2. The phrase "calculating a differential output of a sensing bridge" shall refer to using at least one of analog or digital circuitry to produce a signal that is representative of the value of the differential output of the sensing bridge. The differential output of the sensing bridge 112 may be calculated, by circuit 162, in accordance with the equation of differential output signal_1−signal_2, where signal_1 is Vout_1 and signal_2 is output Vout_2

In the example of FIGS. 2A-B, the external magnetic field is produced by an external magnetic field sources (EMSs) 242 and 243. External magnetic field sources 242 and 243 may be different parts of a conductor that is integrated into the packaging (not shown) of sensor 100. The conductor may be coupled to terminals on the packaging of sensor 100. In operation, the terminals may be connected to different segments of an external wire or conductive trace, thus allowing the sensor 100 to measure the level of electrical current through the external wire or conductive trace. In some implementations, external magnetic field sources 242 and 243 may be part of a wire (or a conductive trace) that is shaped as a loop. The loop may have a U-shape or a C-shape, for example.

In the example of FIGS. 2A-B, the reference magnetic field, is produced by a reference magnetic field sources (RMSs) 241, 242, 243, and 243. Reference magnetic field sources may be electrically coupled to one another and arranged to generate the reference magnetic field at each of MR elements 201-204. Specifically, RMS 241 may be disposed adjacent to MR element 201 and arranged to generate the portion of the reference magnetic field that is incident on MR element 201. RMS 242 may be disposed adjacent to MR element 202 and arranged to generate the portion of the reference magnetic field that is incident on MR element 202. RMS 243 may be disposed adjacent to MR element 203 and arranged to generate the portion of the reference magnetic field that is incident on MR element 203. RMS 244 may be disposed adjacent to MR element 204 and arranged to generate the portion of the reference magnetic field that is incident on MR element 204. The arrow inside each of reference magnetic field sources 241-244 indicates the direction of electrical current flow through that reference magnetic field source.

Arrow 211 shows the orientation of the axis of maximum sensitivity (i.e., pinning direction) of sensing element 201; arrow 221 shows the direction of the external magnetic field at the location of sensing element 201; and arrow 231 shows the direction of the reference magnetic field at the location of sensing element 201. As illustrated, at sensing element 201, the reference magnetic field and the external magnetic field may have substantially the same direction. Moreover, the pinning direction of sensing element 201 may be substantially opposite to the directions (221, 231) of the reference magnetic field and the external magnetic field. Considering the pinning direction of MR element 201, at the location of MR element 201, the directions of the reference magnetic field and the external magnetic field are such that they increase the resistance of MR element 201.

Arrow 212 shows the orientation of the axis of maximum sensitivity (e.g., pinning direction) of sensing element 202; arrow 222 shows the direction of the external magnetic field at the location of sensing element 202; and arrow 232 shows the direction of the reference magnetic field at sensing element 202. As illustrated, at sensing element 202, the reference magnetic field and the external magnetic field may have substantially opposite directions. Moreover, the pinning direction of MR element 202 may be substantially opposite to the direction of the reference magnetic field (232) and substantially the same as the direction of the external magnetic field (222). Considering the pinning direction of MR element 202, at the location of MR element 202, the directions of the reference magnetic field and the external magnetic field are such that the external magnetic field causes a decrease in the resistance of MR element 202, while the reference magnetic field causes an increase in the resistance of MR element 202.

Arrow 213 shows the orientation of the axis of maximum sensitivity of sensing element 203; arrow 223 shows the direction of the external magnetic field at the location of sensing element 203; and arrow 233 shows the direction of the reference magnetic field at the location of sensing element 203. As illustrated, at sensing element 203, the reference magnetic field and the external magnetic field may have substantially the same direction. Moreover, the pinning direction of sensing element 203 may be substantially the same as the directions (223, 233) of the reference magnetic field and the external magnetic field. Considering the pinning direction of MR element 203, at the location of MR element 203, the directions of the reference magnetic field and the external magnetic field are such that they decrease the resistance of MR element 203.

Arrow 214 shows the orientation of the axis of maximum sensitivity of sensing element 204; arrow 224 shows the direction of the external magnetic field at the location of sensing element 204; and arrow 234 shows the direction of the reference magnetic field at the location of sensing element 204. As illustrated, at sensing element 204, the reference magnetic field and the external magnetic field may have substantially opposite directions. Moreover, the pinning direction of MR element 202 may be substantially the same as the direction of the reference magnetic field (234) and substantially opposite to the direction of the external magnetic field (224) Considering the pinning direction of MR element 204, at the location of MR element 204, the directions of the reference magnetic field and the external magnetic field are such that the external magnetic field causes an increase in the resistance of MR element 204, while the reference magnetic field causes a decrease in the resistance of MR element 204.

Equations 1 and 2 below model the values of signals Vout_1 and Vout_2 in the absence of the external magnetic field and the reference magnetic field.

$$\text{Vout\_1} = \frac{MR3}{MR1 + MR3} \tag{1}$$

$$\text{Vout\_2} = \frac{MR4}{MR2 + MR4} \tag{2}$$

Where MR1 is the resistance of MR element 201, MR2 is the resistance MR element 202, MR3 is the resistance of MR element 202, and MR4 is the resistance of MR element 204.

Equations 3-5 below show the values of signals Vout_1 and Vout_2 when a reference magnetic field is applied to the sensing bridge 112, while no external magnetic field is being applied to the sensing bridge 112.

$$\text{VOUT\_1} = \frac{MR3 - x}{(MR1 + x) + (MR3 - x)} = \text{Vout\_1} - \Delta \tag{3}$$

$$\text{VOUT\_2} = \frac{(MR4 - x)}{(MR2 + x) + (MR4 - x)} = \text{Vout\_2} - \Delta = \tag{4}$$

$$\Delta = x/(MR1 + MR3) = x/(MR2 + MR4) \tag{5}$$

Where x is the amount by which the resistance of each of MR elements 201, 202, 203, and 204 is increased or decreased by the reference magnetic field. Together, equations 3-5 illustrate that the output Vout_1 and Vout_2 of sensing bridge 112 (shown in FIG. 2A) are going to be offset by the same amount by the application of the reference magnetic field, when the sensing bridge 112 is configured as shown in FIGS. 2A-B.

Equations 6 and 7 show the common mode and differential outputs of the sensing bridge 112 when a reference magnetic field is applied to the sensing bridge 112, while no external magnetic field is being applied to the sensing bridge 112.

$$differentialOutput = \text{VOUT\_1} - \text{VOUT\_2} = \tag{6}$$

$$\text{Vout\_1} - \Delta - (\text{Vout\_2} - \Delta) = \text{Vout\_1} - \text{Vout\_2}$$

$$commonModeOutput = \frac{\text{VOUT\_1} + \text{VOUT\_2}}{2} = \tag{7}$$

$$\left( \frac{\text{Vout\_1} - \Delta + (\text{Vout\_2} - \Delta)}{2} \right) = \frac{(\text{Vout}_1 \mp \text{Vout\_2})}{2} - \Delta$$

Together, equations 6 and 7 illustrate, that when the sensing bridge 112 is configured as shown in FIGS. 2A-B, the reference magnetic field would have no effect on the differential output of the sensing bridge 112, while affecting only the common mode output of the sensing bridge 112.

Equations 8-10 below show the values of signals Vout_1 and Vout_2 when an external magnetic field is applied to the sensing bridge 112, while no reference magnetic field is being applied to the sensing bridge 112.

9

$$\text{VOUT}_1 = \frac{MR3 - y}{(MR1 + y) + (MR3 - y)} = \text{Vout}_1 - \beta \qquad (8)$$

$$\text{VOUT}_2 = \frac{(MR4 + y)}{(MR2 - y) + (MR4 + y)} = \text{Vout}_2 + \beta = \qquad (9)$$

$$\beta = y/(MR1 + MR3) = y/(MR2 + MR4) \qquad (10)$$

Where y is the amount by which the resistance of each of MR elements 201, 202, 203, and 204 is increased or decreased by the external magnetic field. Together, equations 8-10 illustrate that the output Vout_1 and Vout_2 of sensing bridge 112 (shown in FIG. 2A) are going to be offset in different directions by the application of the external magnetic field, when the sensing bridge 112 is configured as shown in FIGS. 2A-B.

Equations 11 and 12 below show the common mode and differential outputs of the sensing bridge 112 when an external magnetic field is applied to the sensing bridge 112, while no reference magnetic field is being applied to the sensing bridge 112.

$$differentialOutput = \qquad (11)$$

$$\text{VOUT1} - \text{VOUT\_2} = \text{Vout\_1} - \beta - (\text{Vout\_2} + \beta) = \text{Vout\_1} -$$

$$\text{Vout\_2} - 2\beta$$

$$commonModeOutput = \frac{\text{VOUT\_1} + \text{VOUT\_2}}{2} = \qquad (12)$$

$$\left( \frac{\text{Vout\_1} - \beta + (\text{Vout\_2} + \beta)}{2} \right) = \frac{(\text{Vout}_1 \mp \text{Vout\_2})}{2}$$

Together, equations 11 and 12 illustrate, that when the sensing bridge 112 is configured as shown in FIGS. 2A-B, the external magnetic field would have no effect on the common mode output of the sensing bridge 112, while affecting only the differential output of the sensing bridge 112.

The phrase "A and B may have substantially the same direction", as used throughout the disclosure, shall mean that the directions of A and B are within +/−10 degrees from being exactly parallel. The phrase "A and B may have substantially opposite directions", as used throughout the disclosure, shall mean that the directions of A and B are within +/−10 degrees from being exactly opposite (or 180 degrees apart). The phrase "direction A is substantially the same as direction B", as used throughout the disclosure, shall mean that directions A and B are within +/−10 degrees from being exactly the same. The phrase "direction A is substantially opposite to direction B", as used throughout the disclosure, shall mean that the directions of A and B are within +/−10 degrees from being exactly opposite (or 180 degrees apart). In the example of FIGS. 2A-B and 3A-B, when a magnetic field, such as the external magnetic field or the reference magnetic field, has substantially the same direction at two different sensing elements, this means that the sensing elements are configured to sense the same component of the magnetic field. In the example of FIGS. 2A-B and 3A-B, when the direction of a magnetic field, such as the external magnetic field or the reference magnetic field, is substantially the opposite to the direction of the same magnetic field at another sensing element, this means that the two sensing elements are configured to sense different components of the magnetic field, which have substantially opposite directions.

This arrangement shown in FIGS. 2A-B is advantageous because it causes the processing of the common mode response of sensing bridge 112, in the manner discussed above with respect to FIGS. 1A-B, to yield an adjustment signal (e.g., signal 129) that is capable of being used to adjust the sensitivity of sensing bridge 112. Although in the example of FIG. 2B, the external magnetic field source 242/243 is integrated into the packaging of sensor 100. Alternative implementations are possible in which external magnetic field source 242/243 is situated outside of the packaging. Stated succinctly, the present disclosure is not limited to using any specific implementation of external magnetic field source 242/243. The direction of the flow of electrical current through magnetic field source 242/243 is shown by the arrows inside the depiction of magnetic field source 242/243.

Figure 3B:
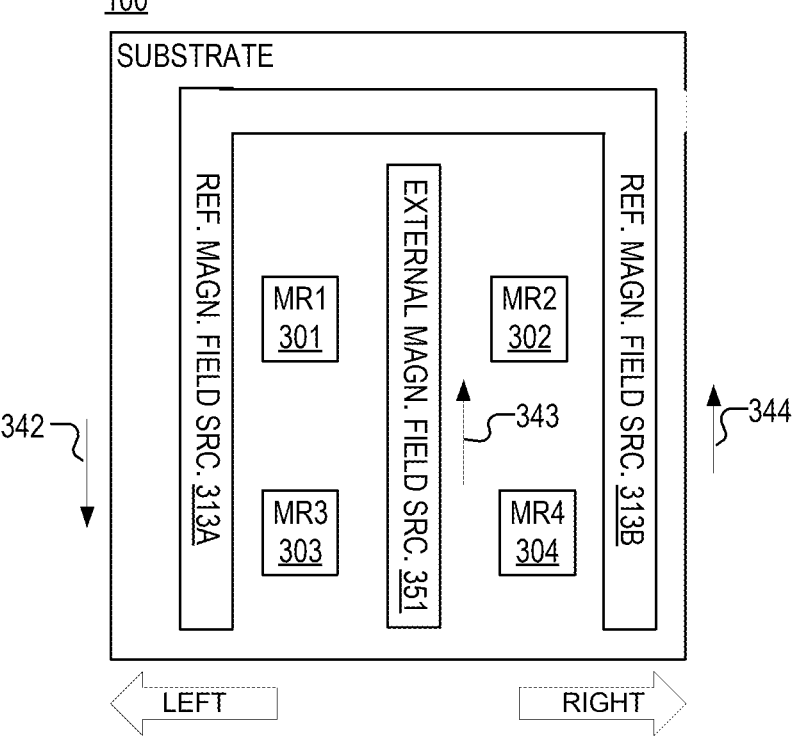
FIG. 3B is a diagram showing the relative positioning of the elements of the sensing bridge of FIG. 2A, according to aspects of the disclosure.

FIGS. 3A-B show an example of one possible configuration of sensing bridge 112, according to aspects of the disclosure. As illustrated, sensing bridge 112 may include sensing elements 301, 302, 303, and 304. Sensing elements 301 and 303 may be coupled in series to form a leg 361. Sensing elements 302 and 304 may be coupled in series to form a leg 362. Legs 361 and 362 may be coupled in parallel between a positive terminal 353 and a negative terminal 352 of sensing bridge 112. The output Vout_1 of sensing bridge 112 may be provided between sensing elements 301 and 303 and the output Vout_2 of sensing bridge 112 may be provided between sensing elements 302 and 304. As discussed above with respect to FIGS. 2A-B, the common mode output of sensing bridge 112 may be calculated, by circuit 161, in accordance with the equation of: common_mode_output= (signal_1+signal_2)/2, where signal_1 is output Vout_1 and signal_2 is output Vout_2. The differential output of sensing bridge 112 may be calculated, by circuit 162, in accordance with the equation of differential output signal_1−signal_2, where signal_1 is Vout_1 and signal_2 is output Vout_2

In the example of FIGS. 3A-B, the external magnetic field is produced by a magnetic field source 351. Magnetic field source 351 may be a conductor that runs through the packaging of sensor 100. In operation, the terminals may be connected to different segments of an external wire or conductive trace, thus allowing sensor 100 to measure the level of electrical current through the external wire or conductive trace. In the example of FIG. 3B, the direction of the flow of electrical current through magnetic field source 351 is denoted by arrow 343.

In the example of FIGS. 3A-B, the reference magnetic field is produced by a reference magnetic field source 313A and a reference magnetic field source 313B. Reference magnetic field sources 313A-B may be different portions of transmitting structure 103 (shown in FIG. 1). Reference magnetic field sources 313A-B may be coupled to one another in series. Arrow 342 shows the direction of the flow of electrical current through reference magnetic field source 313A. Arrow 344 shows the direction of the flow of electrical current through reference magnetic field source 313B. Together, arrows 342 and 343 show that reference magnetic field sources 313A-B may conduct electrical current in opposite directions. In some implementations, reference magnetic field sources may be part of a wire (or a conductive trace) that is shaped as a loop. The loop may have a U-shape or a C-shape, for example.

Sensor 100 may include a substrate 101. Sensing elements 301, 302, 303, and 304 may be formed on substrate 101. Arrow 311 shows the orientation of the axis of maximum sensitivity (e.g., pinning direction) of sensing element 301; arrow 321 shows the direction of the external magnetic field at the location of sensing element 301; and arrow 331 shows the direction of the reference magnetic field at the location of sensing element 301. As illustrated, at sensing element 301, the reference magnetic field and the external magnetic field may have substantially opposite directions. Moreover, the pinning direction of sensing element 301 may be substantially opposite to the direction of the reference magnetic field (331) and substantially the same as the direction (321) of the external magnetic field. Considering the pinning direction of MR element 301, at the location of MR element 301, the direction (331) of the reference magnetic field is such that it increases the resistance of MR element 301 and the direction of the external magnetic field (321) is such that it decreases the resistance of MR element 301.

Arrow 312 shows the orientation of the axis of maximum sensitivity (e.g., pinning direction) of sensing element 302; arrow 322 shows the direction of the external magnetic field at the location of sensing element 302; and arrow 332 shows the direction of the reference magnetic field at the location of sensing element 302. As illustrated, at sensing element 302, the reference magnetic field and the external magnetic field may have substantially the same direction. Moreover, the pinning direction of sensing element 302 may be substantially opposite to the directions (332, 322) of the reference magnetic field and the external magnetic field. Considering the pinning direction of MR element 302, at the location of MR element 302, the direction of the reference magnetic field (332) is such that it increases the resistance of MR element 302 and the direction of the external magnetic field (322) is such that it also increases the resistance of MR element 302.

Arrow 313 shows the orientation of the axis of maximum sensitivity (e.g., pinning direction) of sensing element 303; arrow 323 shows the direction of the external magnetic field at the location of sensing element 303; and arrow 333 shows the direction of the reference magnetic field at the location of sensing element 303. As illustrated, at sensing element 303, the reference magnetic field and the external magnetic field may have substantially opposite directions. Moreover, the pinning direction of sensing element 303 may be substantially the same as the direction of the reference magnetic field (333) and substantially opposite to the direction (323) of the external magnetic field. Considering the pinning direction of MR element 303, at the location of MR element 303, the direction of the reference magnetic field (333) is such that it decreases the resistance of MR element 303 and the direction (323) of the external magnetic field is such that it increases the resistance of MR element 303.

Arrow 314 shows the orientation of the axis of maximum sensitivity (e.g., pinning direction) of sensing element 304; arrow 324 shows the direction of the external magnetic field at the location of sensing element 304; and arrow 334 shows the direction of the reference magnetic field at the location of sensing element 304. As illustrated, at sensing element 304, the reference magnetic field and the external magnetic field may have substantially the same direction. Moreover, the pinning direction of sensing element 304 may be substantially the same as the direction of the reference magnetic field (334) and substantially the same as the direction (324) of the external magnetic field. Considering the pinning direction of MR element 304, at the location of MR element 304, the direction of the reference magnetic field (334) is such that it decreases the resistance of MR element 304 and the direction (324) of the external magnetic field is such that it decreases the resistance of MR element 304.

Equations 13 and 14 below model the values of signals Vout_1 and Vout_2 in the absence of the external magnetic field and the reference magnetic field.

$$Vout\_1 = \frac{MR3}{MR1 + MR3} \tag{13}$$

$$Vout\_2 = \frac{MR4}{MR2 + MR4} \tag{14}$$

Where MR1 is the resistance of MR element 301, MR2 is the resistance MR element 302, MR element is the resistance of MR element 302, and MR4 is the resistance of MR element 304.

Equations 15-17 below show the values of signals Vout_1 and Vout_2 when a reference magnetic field is applied to the sensing bridge 112, while no external magnetic field is being applied to the sensing bridge 112.

$$VOUT\_1 = \frac{MR3 - x}{(MR1 + x) + (MR3 - x)} = Vout\_1 - \Delta \tag{15}$$

$$VOUT\_2 = \frac{(MR4 - x)}{(MR2 + x) + (MR4 - x)} = Vout\_2 - \Delta = \tag{16}$$

$$\Delta = x/(Mr1 + MR3) = x/(MR2 + MR4) \tag{17}$$

Where x is the amount by which the resistance of each of MR elements 301, 302, 303, and 304 is increased or decreased by the reference magnetic field. Together, equations 15-17 illustrate that the outputs Vout_1 and Vout_2 of sensing bridge 112 (shown in FIG. 3A) are going to be offset by the same amount by the application of the reference magnetic field, when the sensing bridge 112 is configured as shown in FIGS. 3A-B.

Equations 18 and 19 show the common mode and differential outputs of the sensing bridge 112 when a reference magnetic field is applied to the sensing bridge 112, while no external magnetic field is being applied to the sensing bridge 112.

$$differentialOutput = VOUT\_1 - VOUT\_2 = \tag{18}$$

$$Vout\_1 - \Delta - (Vout\_2 - \Delta) = Vout\_1 - Vout\_2$$

$$commonModeOutput = \frac{VOUT_1 + VOUT_2}{2} = \tag{19}$$

$$\left(\frac{Vout_1 - \Delta + (Vout_2 - \Delta)}{2}\right) = \frac{(Vout_1 + Vout_2)}{2} - \Delta$$

Together, equations 18 and 19 illustrate, that when the sensing bridge 112 is configured as shown in FIGS. 2A-B, the reference magnetic field would have no effect on the differential output of the sensing bridge 112, while affecting only the common mode output of the sensing bridge 112.

Equations 20-21 below show the values of signals Vout_1 and Vout_2 when an external magnetic field is applied to the sensing bridge 112, while no reference magnetic field is being applied to the sensing bridge 112.

$$VOUT\_1 = \frac{MR3 + y}{(MR1 - y) + (MR3 + y)} = Vout_1 + \beta \qquad (20)$$

$$VOUT\_2 = \frac{(MR4 - y)}{(MR2 + y) + (MR4 - y)} = Vout\_2 - \beta = \qquad (21)$$

$$\beta = y/(MR1 + MR3) = y/(MR2 + MR4) \qquad (22)$$

Where y is the amount by which the resistance of each of MR elements 201, 202, 203, and 204 is increased or decreased by the external magnetic field. Together, equations 8-10 illustrate that the output Vout\_1 and Vout\_2 of sensing bridge 112 (shown in FIG. 2A) are going to be offset in different directions by the application of the external magnetic field, when the sensing bridge 112 is configured as shown in FIGS. 2A-B.

Equations 23 and 24 below show the common mode and differential outputs of the sensing bridge 112 when an external magnetic field is applied to the sensing bridge 112, while no reference magnetic field is being applied to the sensing bridge 112.

$$differentialOutput = VOUT1 - VOUT\_2 = \qquad (23)$$
$$Vout\_1 + \beta - (Vout\_2 - \beta) = Vout\_1 - Vout\_2 + 2\beta$$

$$commonModeOutput = \frac{VOUT\_1 + VOUT\_2}{2} = \qquad (24)$$
$$\left(\frac{Vout\_1 + (Vout\_2 - \beta)}{2}\right) = \frac{(Vout_1 \mp Vout\_2)}{2}$$

Together, equations 23 and 24 illustrate, that when the sensing bridge 112 is configured as shown in FIGS. 2A-B, the external magnetic field would have no effect on the common mode output of the sensing bridge 112, while affecting only the differential output of the sensing bridge 112.

This arrangement, shown in FIGS. 3A-B is advantageous because it causes the processing of the common mode response of sensing bridge 112, in the manner discussed above with respect to FIGS. 1A-B, to yield an adjustment signal (e.g., signal 129) that is capable of being used to adjust the sensitivity of sensing bridge 112. As noted above, equations 1-12 pertain to the operation of the configuration shown in FIGS. 2A-B and equations 13-24 pertain to the operation of the configuration shown in FIGS. 3A-B. In this regard, it will be readily apparent, after reading the present disclosure, that various physical configurations are possible in which the pinning directions of the MR elements in a sensing bridge, as well as the reference and magnetic field directions, are selected in such a way so as to cause the reference magnetic field to elicit a common mode response (without eliciting a differential response) and/or the external magnetic field to elicit a differential response (without eliciting a common mode response) stated succinctly, the present disclosure is not limited to the examples shown in FIGS. 2A-B and 3A-B.

Although in the example of FIG. 3B, the external magnetic field source 351 is integrated into the packaging of sensor 100. Alternative implementations are possible in which external magnetic field source 351 is situated outside of the packaging. In such alternative implementations, sensor 100 may be mounted directly to the side of external magnetic field source 351. Stated succinctly, the present disclosure is not limited to using any specific implementation of external magnetic field source 351.

In the example, of FIGS. 2A-B and 3A-B each of sensing elements 201, 202, 203, 204, 301, 302, 303, and 304 is a giant magnetoresistor (GMR). However, the present disclosure is not limited thereto. As used throughout the disclosure, the terms "magnetic-field sensing element" and/or "sensing element" may refer to a variety of electronic elements that can sense a magnetic field. The magnetic-field sensing element can be, but is not limited to, a Hall Effect element a magnetoresistance element, a magnetotransistor or an inductive coil. As is known, there are different types of Hall Effect elements, for example, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). The substrate 101 may include a silicon substrate and/or any other suitable type of substrate. The present disclosure is not limited to using any specific substrate.

Figure 4:
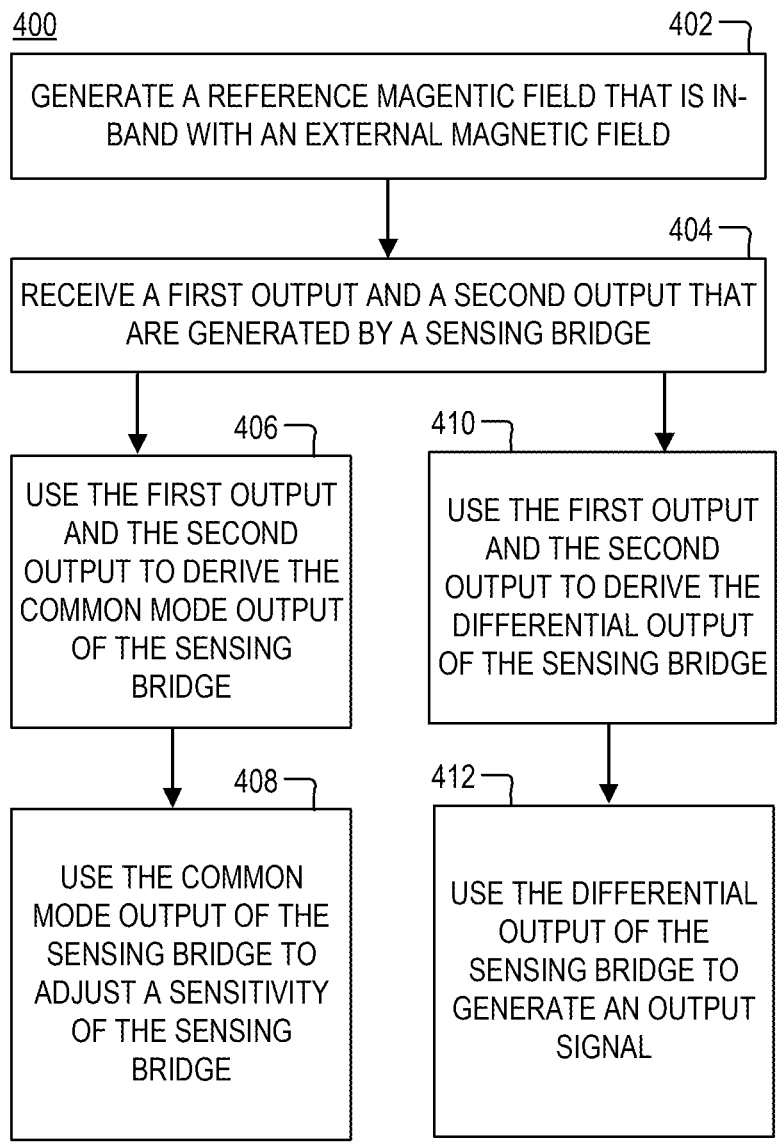
FIG. 4 is a flowchart of an example of a process, according to aspects of the disclosure.

FIG. 4 is a flowchart of an example of a process 400, according to aspects of the disclosure. According to the present example, process 400 is performed by a sensor, such as sensor 100, which is discussed above with respect to FIGS. 4A-B. However, the present disclosure is not limited to any specific entity performing process 400.

At step 402, a reference magnetic field is generated that is in-band with an external magnetic field. In some implementations, step 402 may be performed by using a transmitting structure, such as the transmitting structure 103 which is discussed above with respect to FIGS. 1A-B. However, the present disclosure is not limited to any specific method for generating the reference magnetic field, for as long as the reference magnetic field is in-band with the external magnetic field that is incident on the sensor.

At step 404, a first output and a second output are received that are generated by a sensing bridge. In some implementations, the sensing bridge may be the same or similar to the sensing bridge 112, which is discussed above with respect to FIGS. 1A-B, 2A-B, and 3A-B. However, the present disclosure is not limited to using any specific type of sensing bridge. In some implementations, the first output may be the same or similar to the output Vout\_1, which is discussed above with respect to FIGS. 2A and 3A. Additionally or alternatively, in some implementations, the second output may be the same or similar to the output Vout\_2, which is discussed above with respect to FIGS. 2A and 3A.

At step 406, the first and second outputs of the sensing bridge are used to derive the common mode output of the sensing bridge. In some implementations, the common mode output may be generated in the manner discussed above with respect to FIGS. 2A-B and 3A-B. The common mode output of the sensing bridge may be obtained by using any suitable type of digital or analog circuit. In some implementations, the common mode output may be obtained by using a circuit, such as the circuit 161 which is discussed above with respect to FIGS. 1A-B.

At step 408, the common mode output of the sensing bridge is used to adjust the sensitivity of the sensing bridge. By way of example, a reference field signal may be obtained which is associated with the reference magnetic field. As noted above, the reference field signal may be a component of the common mode output of the sensing bridge that is attributable to the reference magnetic field (as opposed to being attributable to the external magnetic field). The reference field signal may be obtained by demodulating the common mode output of the sensing bridge at the frequency of the reference magnetic field and running the demodulated signal through a low-pass filter. Afterwards, the difference may be determined between the actual value of the reference field signal and the value which the reference field signal would be expected to have under ideal circumstances (absent any distortions due to temperature, mechanical stress, humidity, noise, etc.). The difference may then be used to adjust (up or down) the voltage that is used to drive the sensing bridge, to cause future values of the difference to approach zero following the adjustment.

At step 410, the first and second outputs of the sensing bridge are used to derive a single-ended differential output of the sensing bridge. The differential output of the sensing bridge may be calculated by using any suitable type of analog or digital circuitry. In some implementations, the differential output may be generated in the manner discussed above with respect to FIGS. 2A-B and 3A-B. In some implementations, the differential output may be obtained by using a circuit, such as the circuit 162 which is discussed above with respect to FIGS. 1A-B. However, the present disclosure is not limited to using any specific type of circuit for calculating the differential output of the sensing bridge.

At step 412, the differential output of the sensing bridge is used to generate an output signal that is, at least in part, based on an external field signal associated with the external magnetic field. By way of example, the output signal may indicate one or more of an electrical current level, a position of a target, a speed of a target, and/or any other quantity that is detectable by way of magnetic field measurements. In some implementations, step 410 may be omitted, in which case the output signal may be generated by using directly the first and second outputs of the sensing bridge.

Figure 5:
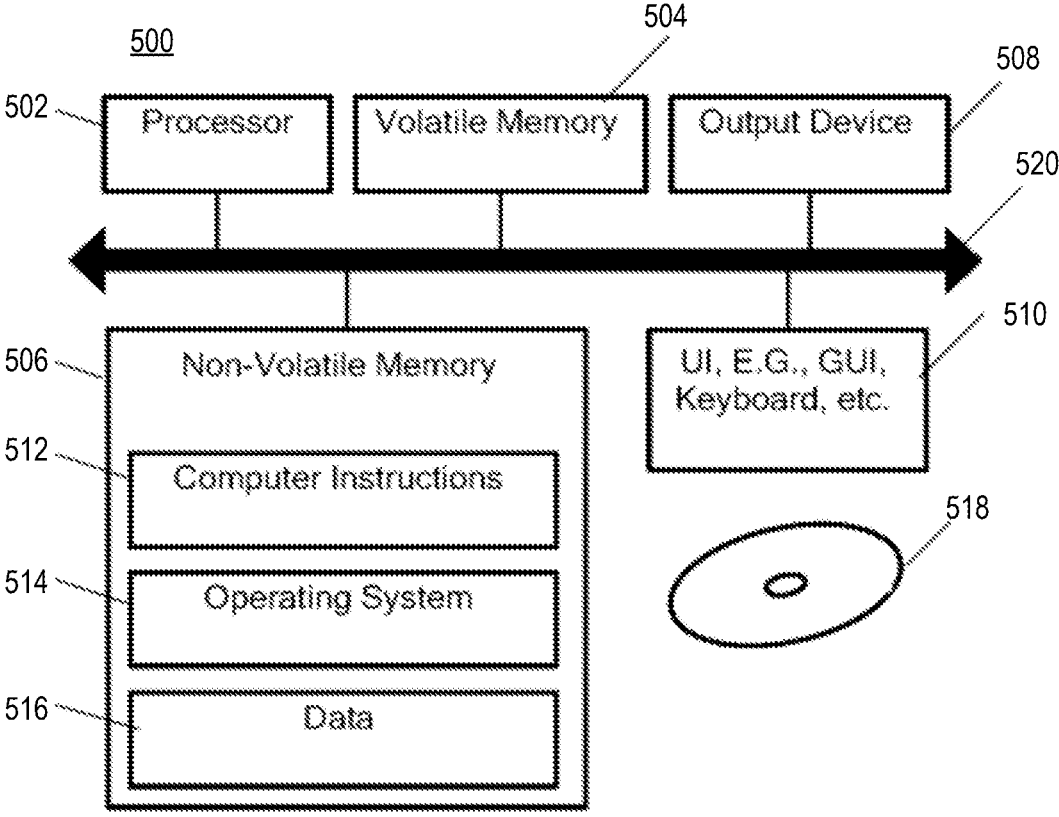

FIG. 5 is a block diagram of an example computer system 500 operative to perform processing, in accordance with the present disclosure. Computer system 500 can perform all or at least a portion of the processing, e.g., steps in the algorithms and methods, described herein. The computer system 500 includes a processor 502, a volatile memory 504, a non-volatile memory 506 (e.g., hard disk), an output device 508 and a user input or interface (UI) 510, e.g., graphical user interface (GUI), a mouse, a keyboard, a display, and/or any common user interface, etc. The non-volatile memory (non-transitory storage medium) 506 stores computer instructions 512 (a.k.a., machine-readable instructions or computer-readable instructions) such as software (computer program product), an operating system 514 and data 516. In some examples/embodiments, the computer instructions 512 can be executed by the processor 502 out of (from) volatile memory 504. In some examples/embodiments, an article 518 (e.g., a storage device or medium such as a hard disk, an optical disc, magnetic storage tape, optical storage tape, flash drive, etc.) includes or stores the non-transitory computer-readable instructions. Bus 520 is also shown.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 500 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit). In some examples, digital logic circuitry, e.g., one or more FPGAs, can be operative as a processor as described herein.

Accordingly, embodiments of the inventive subject matter can afford various benefits relative to prior art techniques. For example, embodiments and examples of the present disclosure can enable or facilitate e.g., systems and components achieving or obtaining an Application Safety Integration Level (ASIL) in accordance with a safety standard such as ISO 26262.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, same, and opposite, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A sensor, comprising:

a reference magnetic field source that is configured to generate a reference magnetic field; a plurality of magnetic field sensing elements arranged in a sensing bridge, the sensing bridge being configured to sense the reference magnetic field and an external magnetic field simultaneously, the sensing bridge being configured to output a first signal and a second signal;

an adjustment circuit that is configured to adjust at least one of a bias current or bias voltage of the sensing bridge based, at least in part, on a difference of a reference field signal that is associated with the reference magnetic field and a nominal value of the reference field signal, the reference field signal being extracted from a common mode signal, the common mode signal being generated at least in part by the sensing bridge; and a processing circuitry that is configured to generate an output signal based on a differential signal that is generated at least in part by the sensing bridge, the differential signal being based on a strength of the external magnetic field, the output signal being indicative of a level of a measured quantity, wherein the plurality of magnetic field sensing elements have respective axes of maximum sensitivity that extend in a substantially same direction, the plurality of magnetic field sensing elements being arranged to form a first leg and a second leg of the sensing bridge that are coupled in parallel with each other, the first leg including at least two of the plurality of magnetic field sensing elements that are arranged to sense components of the reference magnetic field and the external magnetic field that have a substantially same direction, and the second leg including at least two of the plurality of magnetic field sensing elements that are arranged to sense components of the external magnetic field and the reference magnetic field that have substantially opposite directions.

2. The sensor of claim 1, wherein the reference magnetic field is in-band with the external magnetic field.

3. The sensor of claim 1, wherein the reference magnetic field source and the sensing bridge are so configured as to cause the reference magnetic field to elicit a common mode response in the sensing bridge without affecting a differential mode response of the sensing bridge.

4. The sensor of claim 1, wherein the adjustment circuit is arranged to adjust the sensitivity of the sensing bridge by changing the bias voltage of the sensing bridge.

5. The sensor of claim 1, wherein the adjustment circuit is arranged to adjust the sensitivity of the sensing bridge by changing the bias current of the sensing bridge.

6. The sensor of claim 1, wherein the sensing bridge is configured to generate a first signal and a second signal, and the common mode signal is generated in accordance with the equation of: common_mode_signal=(signal_1+signal_2)/2, where signal_1 is the first signal and signal_2 is the second signal.

7. The sensor of claim 1, wherein the sensing bridge is configured to generate a first signal and a second signal, and the differential signal is generated in accordance with the equation of: differential_signal=signal_1−signal 2, where signal_1 is the first signal and signal_2 is the second signal.

8. The sensor of claim 1, wherein each of the magnetic field sensing elements includes one of a giant magnetoresistance (GMR) element, a tunnel magnetoresistance (TMR) element, an anisotropic magnetoresistance (AMR) element, and a magnetic tunnel junction (MTJ) element.

9. The sensor of claim 1, wherein extracting the reference field signal from the common mode signal includes demodulating and filtering the common mode signal to produce the reference field signal.

10. The sensor of claim 1, wherein:

the sensing bridge includes a first magnetic field sensing element (201), a second magnetic field sensing element (202), a third magnetic field sensing element (203), and a fourth magnetic field sensing element (204), the first magnetic field sensing element (201) being coupled in series with the third magnetic field sensing element (203) between a positive terminal and a negative terminal of the sensing bridge, the second magnetic field sensing element (202) being coupled in series with the fourth magnetic field sensing element (204) between a positive terminal and a negative terminal of the sensing bridge, and the first magnetic field sensing element (201) and the third magnetic field sensing element (203) being coupled in parallel with the second magnetic field sensing element (202) and the fourth magnetic field sensing element (204) between positive and negative supply terminals of the sensing bridge;

the first magnetic field sensing element (201) and the fourth magnetic field sensing element (204) are configured to sense a first component of the external magnetic field that has a first direction (221, 224);

the second magnetic field sensing element (202) and the third magnetic field sensing element (203) are configured to sense a second component of the external magnetic field that has a second direction (222, 223), the second direction being substantially opposite to the first direction;

the first magnetic field sensing element (201) and the second magnetic field sensing element (202) are configured to sense a first component of the reference magnetic field that has a third direction (231, 232);

the third magnetic field sensing element (203) and the fourth magnetic field sensing element (204) are configured to sense a second component of the reference magnetic field that has a fourth direction, the fourth direction (233, 234) being substantially opposite to the third direction (231, 232); and the first magnetic field sensing element (201), the second magnetic field sensing element (202), the third magnetic field sensing element (203), and the fourth magnetic field sensing element (204) have respective axes of maximum sensitivity (211, 212, 213, and 214) that extend in substantially the same direction.

11. The sensor of claim 1, wherein:

the reference magnetic field source includes a first portion (313A) that is disposed on a first side of the sensing bridge and a second portion (313B) that is disposed on a second side of the sensing bridge, the second side being opposite to the first side; and the external magnetic field is generated by an external magnetic field source (351) that is disposed between the first and second portions (313A, 313B) of the reference magnetic field source.

12. The sensor of claim 1, wherein the external magnetic field is generated by an external magnetic field source that is shaped as a loop.

13. The sensor of claim 1, wherein the level of the measured quantity includes one of: (i) a level of an electrical current flowing through a conductor that generates the external magnetic field, or (ii) a speed or position of a target that generates the magnetic field.

14. The sensor of claim 1, further comprising circuitry that is configured to extract the reference field signal and a subtraction circuit that is configured to calculate the difference.

15. A sensor, comprising:

a reference magnetic field source that is configured to generate a reference magnetic field;

a plurality of magnetic field sensing elements arranged in a sensing bridge, the sensing bridge being configured to sense the reference magnetic field and an external magnetic field simultaneously, the sensing bridge being configured to output a first signal and a second signal;

an adjustment circuit that is configured to adjust at least one of a bias current or bias voltage of the sensing bridge based, at least in part, on a difference of a reference field signal that is associated with the reference magnetic field and a nominal value of the reference field signal, the reference field signal being extracted from a common mode signal, the common mode signal being generated at least in part by the sensing bridge; and a processing circuitry that is configured to generate an output signal based on a differential signal that is generated at least in part by the sensing bridge, the differential signal being based on a strength of the external magnetic field, the output signal being indicative of a level of a measured quantity, wherein the plurality of magnetic field sensing elements are arranged to form a first leg and a second leg of the sensing bridge that are coupled in parallel with each other, the first leg including at least two of the plurality of magnetic field sensing elements that have substantially opposite axes of maximum sensitivity and are configured to sense components of the external magnetic field and the reference magnetic field that have substantially opposite directions, and the second leg includes at least two of the plurality of magnetic field sensing elements that have substantially opposite axes of maximum sensitivity and are configured to sense components of the external magnetic field and the reference magnetic field that have a substantially same direction.

16. The sensor of claim 15, wherein:
the sensing bridge includes a first magnetic field sensing element (301), a second magnetic field sensing element (302), a third magnetic field sensing element (303), and a fourth magnetic field sensing element (304), the first magnetic field sensing element (301) being coupled in series with the third magnetic field sensing element (303) between a positive terminal and a negative terminal of the sensing bridge, the second magnetic field sensing element (302) being coupled in series with the fourth magnetic field sensing element (304) between a positive terminal and a negative terminal of the sensing bridge, and the first magnetic field sensing element (301) and the third magnetic field sensing element (303) being coupled in parallel with the second magnetic field sensing element (302) and the fourth magnetic field sensing element (304) between positive and negative supply terminals of the sensing bridge;
the first magnetic field sensing element (301), the second magnetic field sensing element (302), the third magnetic field sensing element (303) and the fourth magnetic field sensing element (304) are configured to sense a same component of the external magnetic field;
the first magnetic field sensing element (301) and the third magnetic field sensing element (303) are configured to sense a first component of the reference magnetic field that has a first direction (331, 333);
the second magnetic field sensing element (302) and the fourth magnetic field sensing element (304) are configured to sense a second component of the reference magnetic field that has a second direction (332, 334), the second direction being substantially opposite to the first direction;
the first magnetic field sensing element (301) and the fourth magnetic field sensing element (304) have respective axes of maximum sensitivity (311, 314) that extend in a third direction; and
the second magnetic field sensing element (302) and the third magnetic field sensing element (303) have respective axes of maximum sensitivity (312, 313) that extend in a fourth direction, the fourth direction being substantially opposite to the third direction.

17. The sensor of claim 15, wherein the level of the measured quantity includes one of: (i) a level of an electrical current flowing through a conductor that generates the external magnetic field, or (ii) a speed or position of a target that generates the magnetic field.

18. The sensor of claim 15, further comprising circuitry that is configured to extract the reference field signal and a subtraction circuit that is configured to calculate the difference.

19. A sensor, comprising:
a plurality of magnetic field sensing elements arranged in a sensing bridge, the sensing bridge being configured to output a first signal and a second signal;
a reference magnetic field source that is configured to generate a reference magnetic field;
a feedback loop that is arranged to process a common mode signal of the sensing bridge, the feedback loop including: (i) circuitry that is configured to extract a reference field signal by demodulating and filtering the common mode signal, (ii) a subtraction circuit that is configured to calculate a difference between the reference field signal and a nominal value corresponding to the reference field signal and (ii) an adjustment circuit that is configured to adjust a sensitivity of the sensing bridge based, at least in part, on the difference; and
an output signal path that is configured to generate an output signal that corresponds to an external magnetic field, the output signal being based, at least in part, on a differential signal of the sensing bridge,
wherein: at least two of the plurality of magnetic field sensing elements form a first leg of the sensing bridge and at least two other ones of the plurality of magnetic field sensing elements form a second leg of the sensing bridge; the magnetic field sensing elements in the first leg have substantially opposite axes of maximum sensitivity; the magnetic field sensing elements in the second leg have substantially opposite axes of maximum sensitivity; the magnetic field sensing elements in the first leg are arranged to sense a first component of the reference magnetic field that has a first direction and the magnetic field sensing elements in the second leg are arranged to sense a second component of the reference magnetic field that has a second direction, the second direction being substantially opposite to the first direction; and the magnetic field sensing elements in the first leg and the magnetic field sensing elements in the second leg are arranged to sense a same component of the external magnetic field.

20. A sensor, comprising:
a plurality of magnetic field sensing elements arranged in a sensing bridge, the sensing bridge being configured to output a first signal and a second signal;
a reference magnetic field source that is configured to generate a reference magnetic field;
a feedback loop that is arranged to process a common mode signal of the sensing bridge, the feedback loop including: (i) circuitry that is configured to extract a reference field signal by demodulating and filtering the common mode signal, (ii) a subtraction circuit that is configured to calculate a difference between the reference field signal and a nominal value corresponding to the reference field signal and (ii) an adjustment circuit that is configured to adjust a sensitivity of the sensing bridge based, at least in part, on the difference; and
an output signal path that is configured to generate an output signal that corresponds to an external magnetic field, the output signal being based, at least in part, on a differential signal of the sensing bridge,
wherein: at least two of the plurality of magnetic field sensing elements form a first leg of the sensing bridge and at least two other ones of the plurality of magnetic field sensing elements form a second leg of the sensing bridge; the magnetic field sensing elements in the first leg and the magnetic field sensing elements in the second leg have respective axes of maximum sensitivity that extend in a substantially same direction; the magnetic field sensing elements in the first leg are arranged to sense respective components of the reference magnetic field that have substantially opposite directions; the magnetic field sensing elements in the first leg are arranged to sense respective components of the external magnetic field that have substantially opposite directions; the magnetic field sensing elements in the second leg are arranged to sense respective components of the reference magnetic field that have substantially opposite directions; and the magnetic field sensing elements in the second leg are arranged to sense respective components of the external magnetic field that have substantially opposite directions.

\*    \*    \*    \*    \*